United States Patent [19]

Chan et al.

[11] Patent Number: 5,231,043
[45] Date of Patent: Jul. 27, 1993

[54] CONTACT ALIGNMENT FOR INTEGRATED CIRCUITS

[75] Inventors: Tsiu C. Chan, Carrollton; Frank R. Bryant, Denton, both of Tex.

[73] Assignee: SGS-Thomson Microelectronics, Inc., Carrollton, Tex.

[21] Appl. No.: 748,085

[22] Filed: Aug. 21, 1991

[51] Int. Cl.$^5$ .................. H01L 21/44; H01L 21/48
[52] U.S. Cl. .................. 437/52; 437/195; 437/228; 437/235; 156/641; 156/652; 156/653
[58] Field of Search .............. 437/47, 48, 52, 60, 437/984, 919

[56] References Cited

U.S. PATENT DOCUMENTS

| | | | |
|---|---|---|---|
| 4,795,718 | 3/1989 | Beitman . | |
| 4,951,175 | 8/1990 | Kurosawa et al. | 437/60 |
| 4,978,635 | 12/1990 | Watanabe | 437/52 |
| 5,059,548 | 10/1990 | Kim | 437/60 |

FOREIGN PATENT DOCUMENTS

| | | |
|---|---|---|
| 0318277A2 | 5/1989 | European Pat. Off. . |
| 0385492A2 | 4/1990 | European Pat. Off. . |
| 0405850A2 | 1/1991 | European Pat. Off. . |
| 0439865A3 | 8/1991 | European Pat. Off. . |
| 58-115859 | 7/1983 | Japan . |
| 2-28333 | 1/1990 | Japan . |

OTHER PUBLICATIONS

"Characterizatio of Borosilicate Glass Step Coverage for Mutli-level Interconnection Applications," Journal of the Electrochemical Society, 138 (1991) Mar., No. 3, Manchester, N.H. US, Pierre-Yves Le Saicherre, Alain Rey, and Pierre Chatagnon.

"Limitation of low-temperature low-pressure chemical vapor deposition of SiO2 for the insulation of high-density multilevel metal very large scale integrated circuits", Journal of Vacuum Science & Technology B7 (1989) Mar./Apr. No. 2, New York, US, Paul E. Riley, Vivek D. Kulkarni, and Egil D. Castel.

Primary Examiner—Olik Chaudhuri
Assistant Examiner—H. Jei Tsai
Attorney, Agent, or Firm—Kenneth C. Hill; Lisa K. Jorgenson; Richard K. Robinson

[57] ABSTRACT

A technique for producing self-aligned contact openings is especially useful when the openings are to be made between conductive structures having relatively small separation. Formation of an oxide layer under particular process conditions results in a thicker layer of oxide on top of the conductive structures, and a thinner oxide layer along the sidewalls and in the bottom of the spacing between them. Deposition of such a differential thickness oxide layer can be followed by an unmasked-anisotropic etch in order to clear the oxide from the space between the conductive structures, without removing all of the oxide layer over the conductive structure. Such a technique can be utilized in integrated circuits such as DRAMs, with the word lines allowing for the formation of semi-self-aligned bit lines. The combination of word lines and bit lines can provide for a fully self-aligned contact opening for DRAM cell capacitors.

20 Claims, 3 Drawing Sheets

CONTACT ALIGNMENT FOR INTEGRATED CIRCUITS

CROSS REFERENCE TO RELATED APPLICATIONS

The present application contains subject matter in common with co-pending U.S. Pat. Application Ser. No. 748,290, filed concurrently herewith, titled CONTACT ALIGNMENT FOR NONVOLATILE MEMORY DEVICES, by Tsiu Chiu Chan and Frank Randolph Bryant, which is assigned to the assignee hereof and incorporated by reference hereinto.

BACKGROUND OF THE INVENTION

1. Field of the Invention

The present invention relates generally to integrated circuit devices, and more specifically to techniques for aligning contacts when forming interconnect for integrated circuit devices.

2. Description of the Prior Art

As feature sizes and device sizes shrink for integrated circuits, relative alignment between interconnect layers becomes of critical importance. Misalignment can severely impact the functionality of a device. Misalignment beyond certain minimum tolerances can render a device partly or wholly non-operative.

To insure that contacts between interconnect layers are made properly even if a slight misalignment occurs during masking steps, extra space is usually included in a design around contacts and other conductive features. This extra retained space is known as enclosure. Enclosure sizes of up to a few tenths of a micron are typical for 0.5 to 1.0 micron feature sizes.

Enclosure requirements are not consistent with the continued shrinkage of devices. Enclosure is not related to device functionality, but is used only to ensure that misalignment errors don't cause problems with the device. When designing devices having minimum feature and device sizes, minimizing enclosure requirements can significantly impact the overall device size.

Self-alignment techniques are generally known in the art, and it is known that their use helps minimize enclosure requirements. However, the use of self-alignment techniques has been somewhat limited by device designs in current use. It would be desirable to provide a technique for fabricating integrated circuit devices which increase the number of self-aligned steps, thereby reducing enclosure requirements for the device.

High density dynamic random access memory (DRAM) devices have regular layouts which allow for small device sizes. Obtaining minimum cell sizes is very important to the design of high density DRAMs, such as 16 megabit and 64 megabit devices. The area penalty caused by enclosure requirements can significantly affect overall chip size, since the individual cell sizes are so small for such high density devices.

It would therefore be desirable to provide a cell layout and fabrication technique for high density DRAMs which is as small as possible. Such a fabrication technique preferably includes self-aligned structures and process steps when possible to minimize total cell area. It is further desirable for such a technique to be compatible with process flows currently in standard use.

SUMMARY OF THE INVENTION

Therefore, according to the present invention, a technique for producing self-aligned contact openings is especially useful when the openings are to be made between conductive structures having relatively small separation. Formation of an oxide layer under particular process conditions results in a thicker layer of oxide on top of the conductive structures, and a thinner oxide layer along the sidewalls and in the bottom of the spacing between them. Deposition of such a differential thickness oxide layer can be followed by an unmasked-anisotropic etch in order to clear the oxide from the space between the conductive structures, without removing all of the oxide layer over the conductive structure. Such a technique can be utilized in integrated circuits such as DRAMs, with the word lines allowing for the formation of semi-self-aligned bit lines. The combination of word lines and bit lines can provide for a fully self-aligned contact opening for DRAM cell capacitors.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Figure 1:
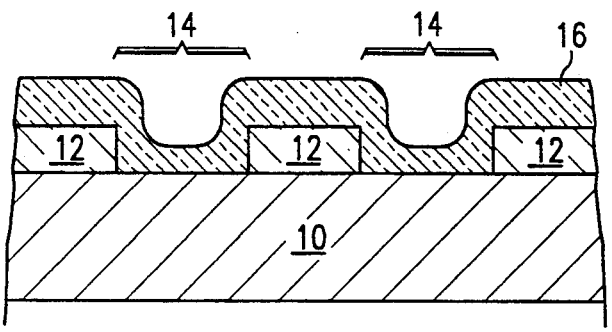
FIGS. 1 and 2 illustrate the formation of conductive and insulating structures according to a preferred embodiment of the present invention.
Figure 2:
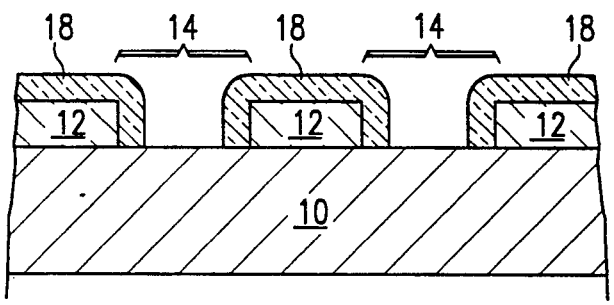

FIGS. 1 and 2 illustrate the use of a preferred technique for self-aligning contacts. As shown in FIGS. and 2, the use is generic to any semiconductor integrated circuit device. FIGS. 3-9 will illustrate the use of the preferred technique to fabricate high density DRAMs.

Referring to FIG. 1, underlying structures on an integrated circuit device are referenced generally with the reference number 10. These structures can include a substrate, field oxide regions, and underlying layers of interconnect. For purposes of describing the present invention, the precise nature of the underlying structures 10 is not important.

On the underlying structure 10, several conductive structures 12 are formed. The conductive structures 12 may be, for example, polycrystalline silicon, or they may be polycrystalline silicon which has been silicided as known in the art. Between the conductive structure 12 are openings 14. Openings 14 are of a relatively small size. The precise size Of openings 14 is somewhat dependent on process conditions as will be described below, but is typically less than approximately 1.2 microns.

According to the present invention, it is desirable to form contacts to the underlying structures in both the openings 14. Contacts must be made with the underlying structures 10 while being insulated from the conductive structures 12.

A layer of oxide 16 is formed over the entire integrated circuit device. The layer 16 is formed in such a manner that it is thicker on top of the conductive structures 12 than along the sidewalls or bottom of the openings 14. Oxide can be deposited to such a differential thickness using Watkins-Johnson Model 998 deposition equipment. The oxide is deposited using chemical vapor deposition (CVD) techniques at approximately one atmosphere pressure. This results in a layer which, for opening dimensions less than approximately 1.2 microns, deposits less oxide on the sidewalls and bottoms of the openings 14. Typically, the width of the vertical portions of the layer 16, in the horizontal portion and the bottom of the openings 14, is approximately half of the depth of the layer 16 over the conductive regions 12.

Equipment such as the W-J 998 deposit oxide at a relatively fast rate at approximately standard atmospheric pressure. This results in deposition of a layer which has the properties described above, with the deposited oxide layer being thinner along the vertical sidewalls and the bottom of opening which are relatively small. It appears that the total volume of oxide deposited in the openings 14 is approximately the same as that which would have been deposited if a flat continuous surface existed between the conductive layers 12. Since this volume of material is spread over a larger surface, it forms a thinner layer along the sides and bottom of the openings 14.

Referring to FIG. 2, the oxide layer 16 is anisotropically etched without a mask to form the oxide regions 18 surrounding the conductive structures 12. The oxide layer 16 is cleared from the bottom of the openings 14, and remains on the sidewalls of the openings 14. Also, since the layer 16 was deeper over the conductive structures 12, a portion of the oxide regions 18 remains above each of the conductive structures 12. The thickness of the regions 18 on both of the conductive structures 12 is dependent upon the original thickness of the layer 16, and the time to which the device is subjected to an anisotropic etch. Complete removal of the regions 18 above the conductive structures 12 is prevented by the use of endpoint detection techniques as known in the art which detect when the layer 16 has been removed from the bottom of the openings 14.

Another conductive interconnect layer (not shown) can now be formed over the device. Contacts will be made through the openings 14 with the underlying region 10. With respect to the conductive structures 12, the contact openings have been self-aligned, so that no masking step is required to form them. This eliminates the requirement for the enclosure which is normally needed with each masking step, allowing the integrated circuit device to be made smaller.

Assuming that the conductive structures 12 project vertically out of the plane of the drawing of FIGS. 1 and 2, a next conductive layer will be only self-aligned in a left-to-right direction. A mask must still be used to define the openings in the direction perpendicular to the plane of the drawing. Thus, the described technique has resulted in a contact opening which has been aligned in a single direction, which is generally referred to herein as a semi-self-aligned contact. If the conductive structure 12 is patterned so as to define a square opening when seen from above, a contact opening which is fully self-aligned can be made since it will be separated from the surrounding conductive structure by the conductive regions 18 on all sides. Thus, certain device designs will allow a fully self-aligned contact to be made.

The technique described above, using deposition of oxide to differential depths followed by an unmasked-anisotropic etchback, can be used in numerous different types of integrated circuit devices. It may be used, for example, in memory devices such as SRAMs, DRAMs, and EPROMs and EEPROMs. The technique may also be used in programmable logic devices of various types, and will be seen to be useful in many types of devices wherein regular arrays of closely spaced signal lines are required.

Figure 3:
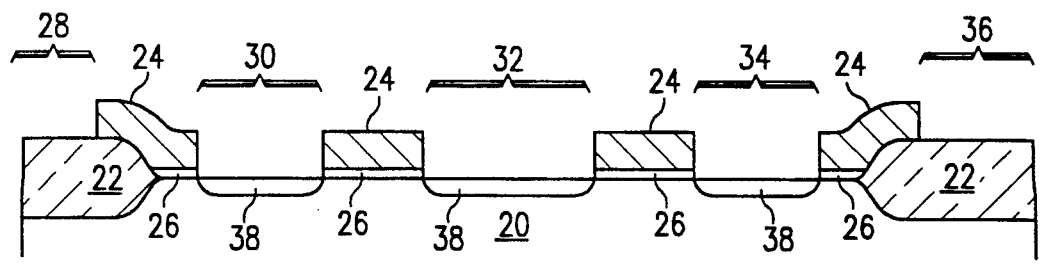
FIG. 3-7 are cross sectional views illustrating the formation of dynamic random access memory devices using contact formation techniques according to the present invention.

FIGS. 3-9 illustrate the use of the technique described above in the design and layout of high density DRAM devices. Referring to FIG. 3, a DRAM is formed in a semiconductor substrate 20. Field oxide regions 22 are used to separate active regions between them. Polycrystalline silicon word lines 24 are formed on the chip as known in the art, and are separated from the substrate 20 by gate oxide regions 26. After the word lines 24 have been formed and patterned, lightly doped drain (LDD) regions 38 are implanted into the substrate 20.

Processing up to this point has been standard as known for DRAM devices. Openings 28, 30, 32, 34, and 36 are formed between the parallel word lines 24. For purposes of the present invention, the width of openings 28-36 is preferably less than approximately 1.2 microns, allowing the technique described above in conjunction with FIGS. 1 and 2 to be utilized.

Figure 4:
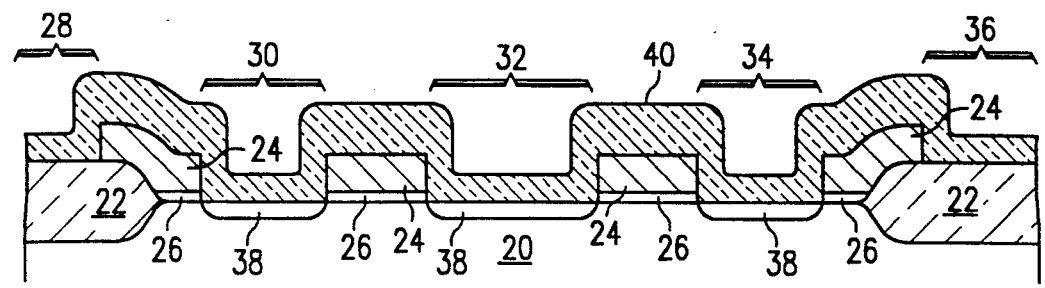

Referring to FIG. 4, oxide layer 40 is formed over the surface of the device. Oxide layer 40 is formed nominally to a thickness approximately twice what will be needed for sidewalls to be formed alongside the word lines 24. If sidewalls having a thickness of approximately 2,000 angstroms are required, the oxide layer 40 is deposited to a depth of approximately 4,000 angstroms over the word lines 24. This will give a depth to layer 40 of approximately one-half of this amount, or 2,000 angstroms, in the bottom of each of the openings 28-36.

The entire device is then subjected to an anisotropic etchback step as described above in connection with FIG. 2. This etching step is done without any masking in the memory array. However, it may be desirable to mask all of the periphery regions of the device. In most cases, there will not be a regular array of signal lines in the periphery as there is in the array, and the described technique may not be applicable there. This masking of the regions in the periphery is for protection purposes only, and is generally a non-critical mask step.

Figure 5:
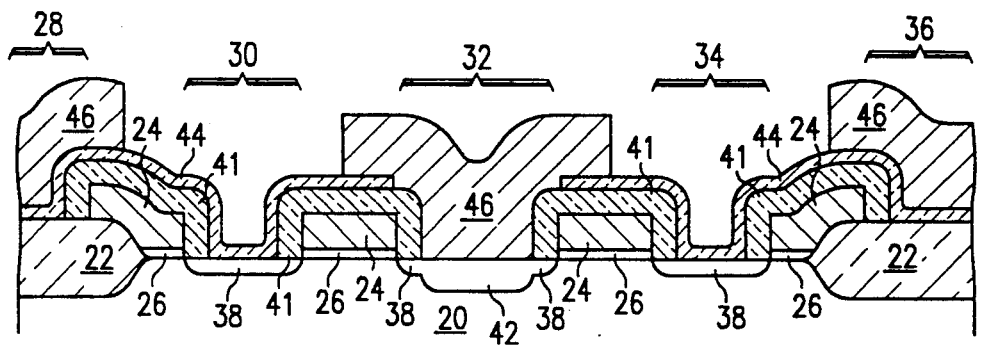

Referring to FIG. 5, the anisotropic etchback step just described results in the formation of oxide regions 41 surrounding the word lines 24. If it is desired to form highly doped drain regions 42 at this time, a patterning and implant step can be performed at this time. A dielectric layer 44, preferably an oxide layer, is then deposited over the device to a thickness of approximately 800 angstroms. The layer 44 is then patterned to define bit line contacts. As described above in connection with FIG. 2, the openings between the word lines 24 would be self-aligned with respect to the word lines, but will not be self-aligned in a direction perpendicular to the plane of the drawing of FIG. 5. Therefore, the bit line contacts are only semi-self-aligned, with a mask being necessary to align them in the direction perpendicular to the plane of the drawing of FIG. 5. As will be appreciated in connection with the discussion of FIG. 9, the alignment of the bit line contacts in this direction is not nearly as critical as their alignment in the left-to-right direction as shown in FIG. 5. Thus, the tolerances for the bit line contact masking step need not be quite as tight as more tightly controlled masking steps at other stages of the device fabrication.

As shown in FIG. 5, a bit line contact is made in opening 32. Openings 30 and 34 will be used later for cell capacitor formation. Openings 28 and 36 contain bit lines, but the substrate contacts are formed in locations other than in the plane of the drawing of FIG. 5.

A layer of polycrystalline silicon 46 is deposited over the entire surface of the device to be used to form bit lines. The bit line layer 46 is preferably silicided as known in the art. Silicided layer 46 is patterned to define bit lines running approximately left-to-right across the drawing of FIG. 5. As will be described in more detail in conjunction with FIG. 9, the bit lines 46 have a somewhat serpentine shape, so that they do not form a continuous cross section in the plane of the drawing of FIG. 5.

Figure 6:
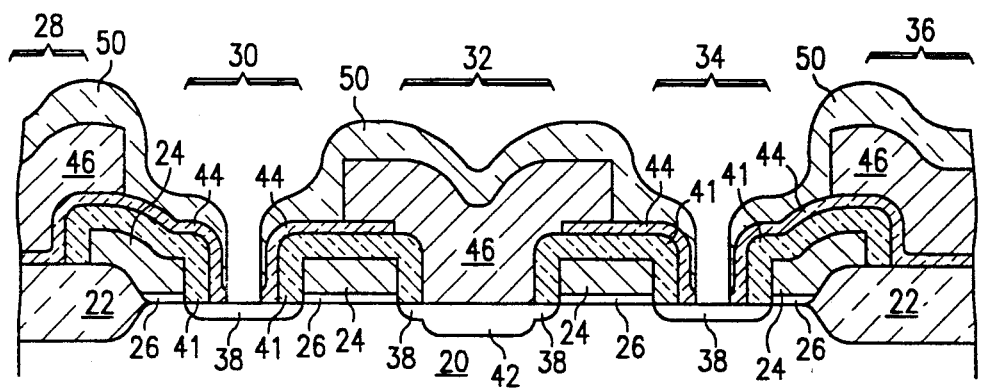

Referring to FIG. 6, an oxide layer 50 is formed over the entire surface of the device as described in connection with FIG. 1. This layer will have a thickness along vertical sidewalls and in the bottoms of the openings 30 and 34 which is approximately one-half that of the layer thickness in remaining regions on the device. The openings 30 and 34 shown in FIG. 6 are now surrounded on two sides by word lines 24, and on two other sides by the bit lines 46. After depositing oxide layer 50, a blanket anisotropic etch is performed over the entire device to open vias in regions 30 and 34 to underlying LDD regions 38. As described above, it is preferable to mask off the periphery of the device during this blanket anisotropic etch step.

Figure 7:
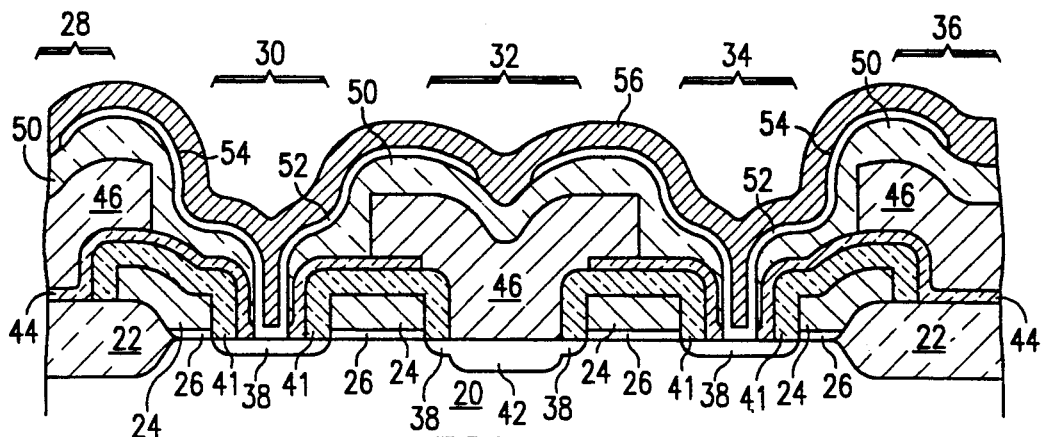

Referring to FIG. 7, a layer of polycrystalline silicon 52 is deposited over the surface of the device, and patterned and etched to define capacitor charge storage plates for the DRAM cells. A capacitor dielectric, preferably a sandwich of nitride between two layers of oxide, generally referred to as ONO, is then formed over the charge storage plates 52. Such ONO layer is quite thin, and is formed on the upper surfaces 54 of the charge storage plates 52. A polycrystalline silicon capacitor reference plate 56 is then formed over the entire surface of the device.

Formation of the capacitor as described in connection with FIG. 7 is conventional, and other techniques may be used if desired. For example, one capacitor design utilizing multiple charge storage and reference plates is described in U.S. Pat. No. 5,006,481, issued to Chan and Bryant. The design shown in FIG. 7 utilizes a buried bit line 46, to which metal bit lines are preferably strapped as needed as known in the art. Processing continues from the structure shown in FIG. 7 in a conventional manner.

Figure 8:
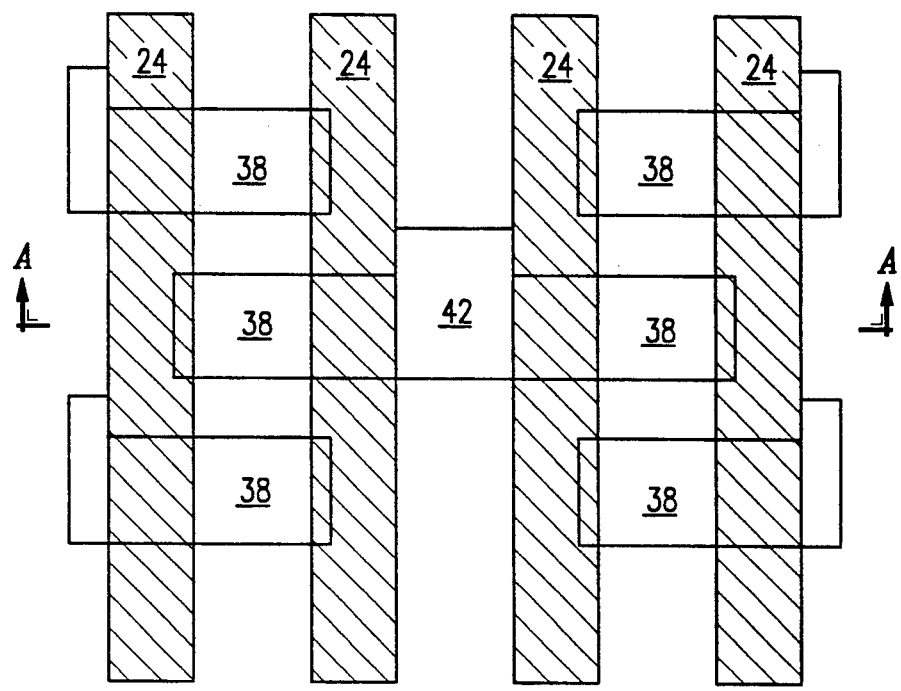
FIGS. 8 and 9 are plan views of a portion of an integrated circuit device at different stages of processing utilizing the techniques described in connection with FIGS. 3-7.
Figure 9:
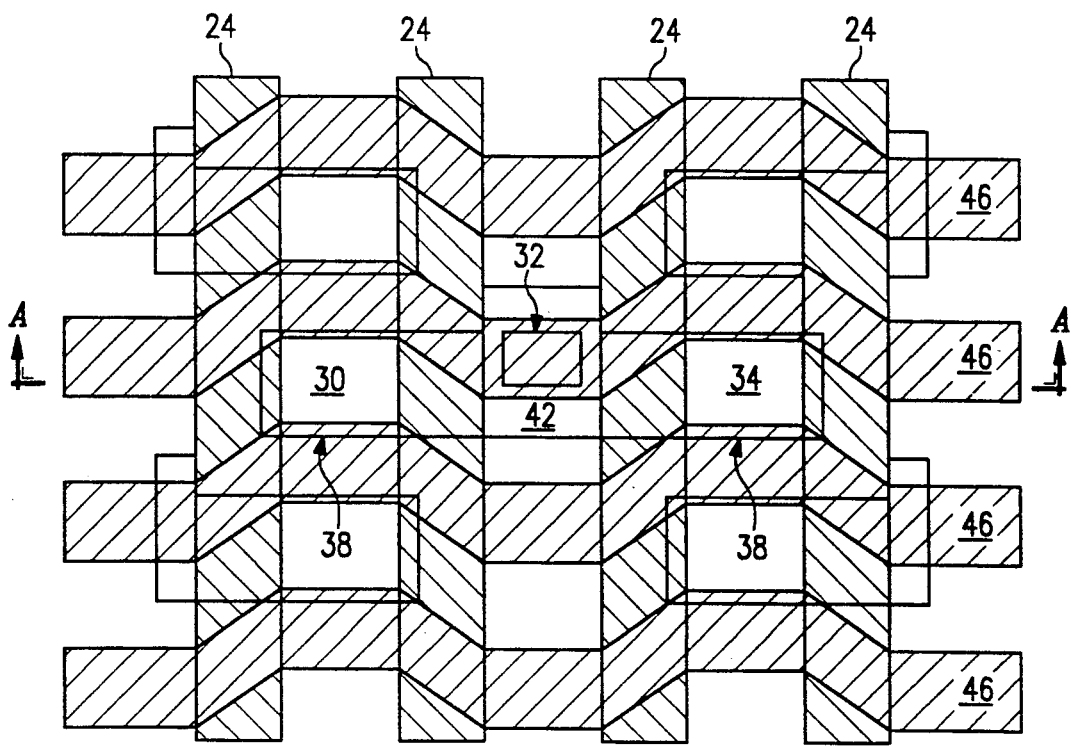

FIGS. 8 and 9 are top views of a portion of a DRAM integrated circuit device in various stages of fabrication. FIGS. 8 and 9 correspond to FIGS. 3-7. The cross-sectional line A—A in FIGS. 8 and 9 shows the location and direction of the cross-sections shown in FIGS. 3-7.

In FIG. 8, the active region is defined by LDD regions 38 and heavily doped region 42. Word lines 42 are straight and parallel passing the length of the array. In FIG. 8, the blank regions between the active areas contain field oxide. Word lines 24 pass over field oxide and active areas as known in the art.

Referring to FIG. 9, when the bit lines 46 are placed over the device, they have a somewhat serpentine shape as shown. This causes them to appear discontinuous as shown in the cross-sectional view of FIG. 7. Opening 32 is the bit line contact to the underlying active area 42. As described above, it is self-aligned in the left-to-right direction as shown in FIG. 9, but is aligned by mask in the up and down direction in the plane of the drawing of FIG. 9. Since all of the bit lines 46 are patterned together, a slight misalignment of the active contact opening 32 in such direction is not critical. Thus, the bit line opening 32 is semi-self-aligned using the terminology defined earlier.

The cell capacitors make contact with the underlying substrate through openings 30 and 34. Both openings 30 and 34 are surrounded by previously defined bit lines and word lines. Thus, when the oxide layer 50 (not shown in FIG. 9) is deposited over the device and anisotropically etched, openings 30 and 34 are completely surrounded by the oxide surrounding regions which remain. Thus, the capacitor plate contacts are fully self-aligned, with no masking required at all. These contacts are separated from the word lines 24 and bit lines 46 by sidewall oxide regions which remain after the self-aligned contact definition step.

The fabrication technique and layout described above results in a DRAM cell having a minimal size. No enclosure is needed in the bit line direction for the bit line contacts, and no enclosure is needed at all for the capacitor cell contacts. Alignment of the bit line contact in the up-down direction as shown in FIG. 9 is not critical, since there are no closely adjacent structures to be spaced away from. Thus, alignment of the bit line contacts and the capacitor contact is done with a minimum amount of spacing in the directions in which spacing is critical.

It will be appreciated by those skilled in the art that various modifications can be made to the techniques described above. For example, the deposition of oxide to different depths is not required for the self-alignment techniques described. Instead, an oxide layer can be formed over each of the word lines and bit lines, in addition to those described, prior to patterning such lines. In both cases, instead of depositing oxide to a differential depth, an additional layer of oxide can be deposited conformally, followed by an anisotropic etchback. This uses techniques known in the art, but requires additional effort since an oxide layer as well as a poly layer must be etched when defining the word lines and bit lines. However, in both cases a semi-self-aligned bit line contact and a fully self-aligned capacitor contact are provided.

While the invention has been particularly shown and described with reference to a preferred embodiment, it will be understood by those skilled in the art that various changes in form and detail may be made therein without departing from the spirit and scope of the invention.

What is claimed is:

1. A method for forming self-aligned contacts on an integrated circuit device, comprising:
   forming lower conductive regions over an underlying surface, wherein the lower conducive regions have spaces between them to expose portions of the underlying surface;
   forming an insulating layer over the lower conductive regions and the exposed underlying surface regions, wherein the insulating layer is differentially deposited during a single deposition step to have a first thickness over the lower conductive regions and a second thickness over the exposed underlying surface portions which is less than the first thickness;
   anisotropically etching the insulating layer to expose the underlying surface portions, whereby a portion of the differentially deposited layer remains over the lower conductive regions; and
   forming upper conductive regions over the insulating layer, wherein the upper conductive regions contact the exposed portions of the underlying surface.

2. The method of claim 1, wherein the spaces between the lower conductive regions have a width less than approximately 1.2 microns.

3. The method of claim 2, wherein the insulating layer comprises silicon oxide.

4. The method of claim 3, wherein the oxide is deposited at a constant depth/unit area, except in the spaces between the lower conductors wherein the volume of deposited oxide is approximately the same as would be deposited over a lower conductive area having the same size as the spaces.

5. The method of claim 4, wherein the oxide is deposited at approximately atmospheric pressure.

6. The method of claim 1, wherein the second thickness is approximately one-half the first thickness, wherein, after said anisotropic etching step, the remaining insulating layer over the lower conductive regions has approximately the second thickness.

7. The method of claim 1, wherein the lower conductive regions comprise a plurality of parallel elongate conductors, and wherein said upper conductive regions forming step comprises the steps of:
   forming a second insulting layer over the entire device;
   forming a patterning mask over the second insulating layer, wherein the mask defines contacts to the upper conductive regions in a direction approximately perpendicular to the lower conductive regions;
   etching the second insulating layer through the mask to expose portions of the underlying surface through the defined contacts;
   forming a conductive layer over the entire device;
   etching the conductive layer to define the upper conductive regions.

8. The method of claim 1, wherein the lower conductive regions surround a space through which a contact is desired, and wherein said upper conductive regions forming step comprises the steps of:
   forming a conductive layer over the entire device;
   anisotropically etching the conductive layer to define the upper conductive regions.

9. The method of claim 8, wherein said forming lower conductive regions step comprises the steps of:
   forming first elongate parallel conductors over the underlying surface;
   forming a first dielectric layer over the first conductors; and
   forming second elongate parallel conductors over the first dielectric layer in a direction approximately orthogonal to the first conductors, whereby a desired contact space is defined as an area surrounded on two sides by first conductors and on two sides by second conductors.

10. The method of claim 1, wherein the insulating layer comprises oxide and the lower and upper conductive regions comprise conductive polycrystalline silicon.

11. A method for forming DRAM cells, comprising the steps of:
   oxidizing a substrate to form a pattern of field oxide regions and active regions;
   forming a plurality of parallel word lines over the substrate;
   forming a first insulating layer over the word lines and on sidewalls thereof, wherein the substrate is exposed between the word lines to define a plurality of bit line contacts;
   forming a plurality of bit lines crossing the word lines and contacting the substrate through the bit line contacts;
   forming a second insulating layer over the entire device, wherein the second insulating layer is differentially deposited during a single deposition step to have a greater thickness over the bit lines than over active regions to which capacitor contact is to be made;
   anisotropically etching the second insulating layer without a mask to expose active regions of the substrate to which capacitor contact is to be made; and
   forming cell capacitors in contact with the exposed active regions.

12. The method of claim 11, wherein said first insulating layer forming step comprises the steps of:
   forming a first dielectric layer on tops and sidewalls of the word lines, wherein elongate substrate regions are exposed;
   forming a second dielectric layer over the entire device;
   masking the second dielectric layer in the direction of the word lines;
   anisotropically etching the second dielectric layer, wherein bit line contact openings are formed to substrate active areas, such openings being self aligned in a direction orthogonal to the word lines.

13. The method of claim 12, wherein the first dielectric layer forming step comprises the steps of:
   forming the dielectric layer over the word lines and the underlying substrate, wherein the dielectric layer has a first thickness over the word lines, and a second thickness over the exposed underlying substrate which is less than the first thickness; and
   anisotropically etching the first dielectric layer without a mask to leave behind insulating material on the top and sides of the word lines.

14. The method of claim 13, wherein spaces between the word lines have a width less than approximately 1.2 microns.

15. The method of claim 14, wherein the first dielectric layer is oxide which is deposited at a constant depth/unit area, except in the spaces between the word lines wherein the volume of deposited oxide is approximately the same as would be deposited over a word line having the same size as the spaces.

16. The method of claim 15, wherein the oxide is deposited at approximately atmospheric pressure.

17. The method of claim 11, wherein the second insulating layer forming step comprises the steps of:
forming the second insulating layer over the entire device, wherein the dielectric layer has a first thickness over the bit lines, and a second thickness over the substrate active regions surrounded by the bit lines and word lines which is less than the first thickness; and anisotropically etching the second insulating layer without a mask to leave behind insulating material on the top and sides of the bit lines.

18. The method of claim 17, wherein spaces between the bit lines have a width less than approximately 1.2 microns.

19. The method of claim 18, wherein the second insulating layer is oxide which is deposited at a constant depth/unit area, except in the spaces between the bit lines wherein the volume of deposited oxide is approximately the same as would be deposited over a bit line having the same size as the spaces.

20. The method of claim 19, wherein the oxide is deposited at approximately atmospheric pressure.

* * * * *